United States Patent
Bhat et al.

(10) Patent No.: US 9,627,573 B2
(45) Date of Patent: Apr. 18, 2017

(54) OPTICAL SENSOR HAVING A LIGHT EMITTER AND A PHOTODETECTOR ASSEMBLY DIRECTLY MOUNTED TO A TRANSPARENT SUBSTRATE

(71) Applicant: Maxim Integrated Products, Inc., San Jose, CA (US)

(72) Inventors: Jerome C. Bhat, Palo Alto, CA (US); Dan G. Allen, Cupertino, CA (US); Richard I. Olsen, Truckee, CA (US); Kumar Nagarajan, Cupertino, CA (US)

(73) Assignee: Maxim Integreated Products, Inc., San Jose, CA (US)

( * ) Notice: Subject to any disclaimer, the term of this patent is extended or adjusted under 35 U.S.C. 154(b) by 107 days.

(21) Appl. No.: 14/625,753

(22) Filed: Feb. 19, 2015

(65) Prior Publication Data

US 2015/0243824 A1    Aug. 27, 2015

Related U.S. Application Data

(60) Provisional application No. 61/942,687, filed on Feb. 21, 2014.

(51) Int. Cl.
*G02B 27/00* (2006.01)
*H01L 31/167* (2006.01)
*H01L 31/147* (2006.01)

(52) U.S. Cl.
CPC .......... *H01L 31/167* (2013.01); *H01L 31/147* (2013.01)

(58) Field of Classification Search
CPC .......................... H01L 31/147; H01L 31/167
USPC .................................................. 250/551
See application file for complete search history.

(56) References Cited

U.S. PATENT DOCUMENTS

| | | | |
|---|---|---|---|
| 5,498,870 A * | 3/1996 | Ishizuka | G01D 5/38 250/231.16 |
| 6,864,116 B1 | 3/2005 | Kim et al. | |
| 6,943,423 B2 | 9/2005 | Kim | |
| 6,943,424 B1 | 9/2005 | Kim | |
| 7,038,287 B2 | 5/2006 | Kim et al. | |
| 7,122,874 B2 | 10/2006 | Kim | |
| 7,141,869 B2 | 11/2006 | Kim et al. | |
| 7,291,518 B2 | 11/2007 | Kim | |
| 7,384,818 B2 | 6/2008 | Kim et al. | |
| 2013/0208264 A1* | 8/2013 | Ahadian | G01M 11/3145 356/73.1 |

FOREIGN PATENT DOCUMENTS

JP          58-101476       *  6/1983

* cited by examiner

*Primary Examiner* — Thanh Luu
(74) *Attorney, Agent, or Firm* — Advent, LLP

(57) ABSTRACT

An optical sensor is described that includes a light emitter and a photodetector assembly directly attached to a transparent substrate. In one or more implementations, the optical sensor comprises at least one light emitter and a photodetector assembly (e.g., photodiodes, phototransistors, etc.). The light emitter(s) and the photodetector assembly are directly mounted (e.g., attached) to a transparent substrate.

18 Claims, 6 Drawing Sheets

OPTICAL SENSOR HAVING A LIGHT EMITTER AND A PHOTODETECTOR ASSEMBLY DIRECTLY MOUNTED TO A TRANSPARENT SUBSTRATE

BACKGROUND

Electronic devices, such as smart phones, tablet computers, digital media players, and so forth, increasingly employ optical (e.g., light) sensors to control the manipulation of a variety of functions provided by the device. For example, optical sensors are commonly used by electronic devices to detect ambient lighting conditions in order to control the brightness of the device's display screen. Typical optical sensors employ photodetectors such as photodiodes, phototransistors, or the like, which convert received light into an electrical signal (e.g., a current or voltage).

Optical sensors are commonly used in gesture sensing devices. Gesture sensing devices enable the detection of physical movement (e.g., "gestures") without the user actually touching the device within which the gesture sensing device resides. The detected movements can be subsequently used as input commands for the device. In implementations, the electronic device is programmed to recognize distinct non-contact hand motions, such as left-to-right, right-to-left, up-to-down, down-to-up, in-to-out, out-to-in, and so forth. Gesture sensing devices have found popular use in handheld electronic devices, such as tablet computing devices and smart phones, as well as other portable electronic devices, such as laptop computers, video game consoles, and so forth.

Optical sensors may also be utilized in bio-sensing and environmental sensing applications. For example, optical sensors can be used to sense blood pulse rates, blood oxygen rates, blood alcohol levels, and body or environmental temperature.

SUMMARY

An optical sensor is described that includes a light emitter and a photodetector assembly directly attached to a transparent substrate. In one or more implementations, the optical sensor comprises at least one light emitter and a photodetector assembly (e.g., photodiodes, phototransistors, etc.) that are directly mounted (e.g., attached) to a transparent substrate.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Typically, light sensing devices include a mold and a housing positioned over a light emitter and a light sensor. For example, these architectures may include a housing and/or a mold structure that includes cavities corresponding to the light emitter and the light sensor. Due to this architecture, these light sensing devices are positioned beneath a surface of an electronic device (e.g., a tablet, a smartphone, etc.) since water and/or dust may accumulate in these cavities.

Accordingly, an optical sensor is described that includes a light emitter and a photodetector sensor that is directly attached to a transparent substrate. In one or more implementations, the optical sensor comprises at least one light emitter and at least one photodetector sensor (e.g., photodiodes, phototransistors, etc.) that directly mount to the transparent substrate. The direct mounting (e.g., attachment) of the transparent substrate to the semiconductor substrate may allow for footprint reduction and cost reduction due to a reduction in bonding material (compared with other light sensors utilizing molding and/or housing architectures). Additionally, an optical sensor may comprise a sealed architecture that provides protection from various environmental elements.

Example Implementations

Figure 1A:
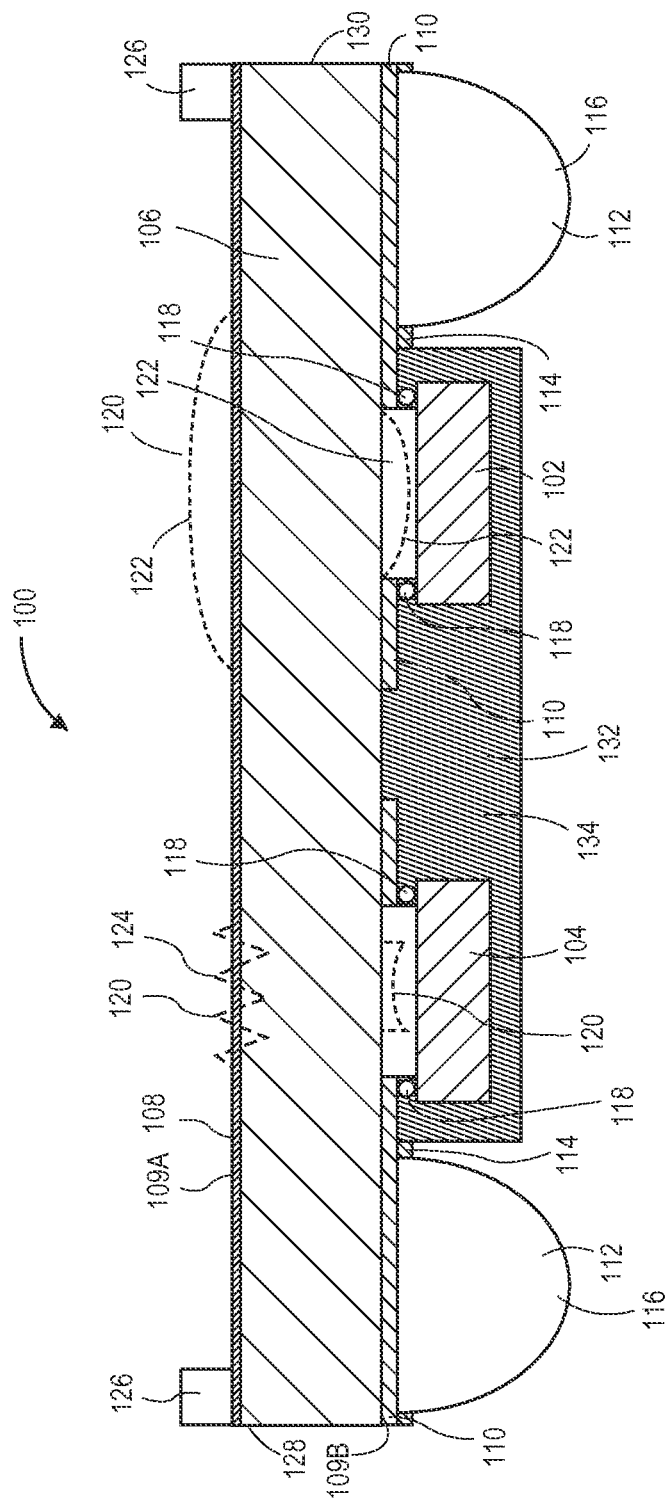
FIG. 1A is a diagrammatic partial cross-sectional side view illustrating an optical sensor having a semiconductor substrate and a transparent substrate directly attached to the semiconductor substrate in accordance with an example implementation of the present disclosure.
Figure 1B:
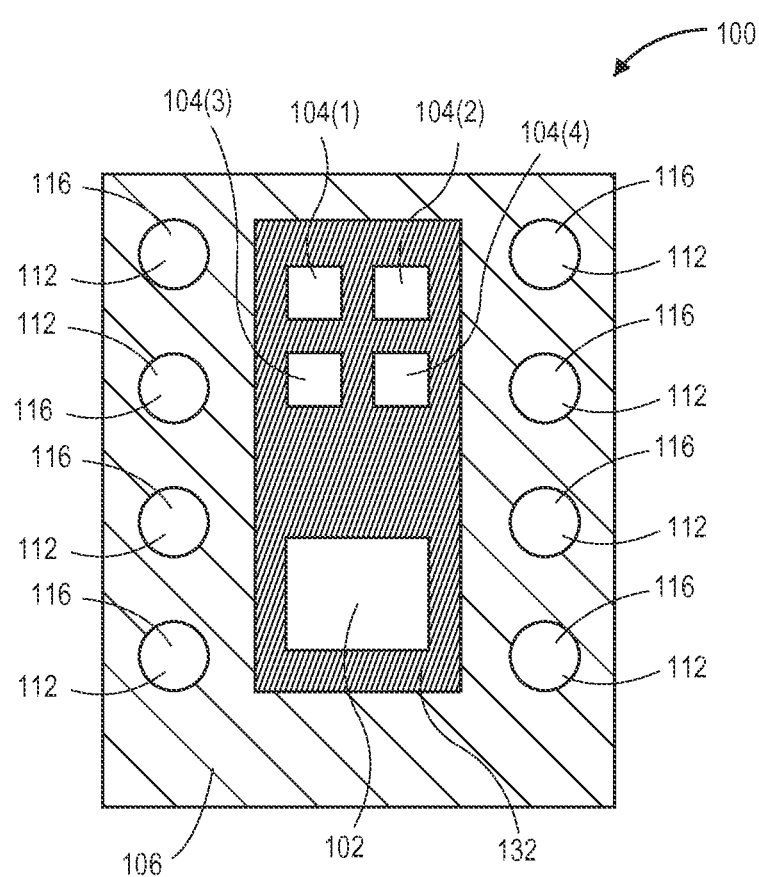
FIG. 1B is a diagrammatic bottom view illustrating the optical sensor illustrated in FIG. 1A.

FIGS. 1A and 1B illustrate an optical sensor 100 in accordance with an example implementation of the present disclosure. The optical sensor 100 includes a photodetector assembly 102 that includes one or more photosensitive sensors (e.g., photodetector sensors). The photodetector sensors may be configured in a variety of ways. For example, the photodetector sensors may be comprised of a photo sensor diode, a phototransistor, a photoresistor or the like. The photodetector assembly 102 is capable of detecting light and providing a signal in response thereto. The photodetector assembly 102 may provide a signal by converting light into current or voltage based upon the intensity of the detected light. Thus, once a photodetector assembly 102 is exposed to light, multiple free electrons may be generated to create a current. The photodetector assembly 102 is configured to detect light in the visible light spectrum, the infrared light spectrum, and/or the ultraviolet spectrum. As used herein, the term light is contemplated to encompass electromagnetic radiation occurring in the visible light spectrum, the infrared light spectrum, and/or the ultraviolet spectrum.

The visible light spectrum (visible light) includes electromagnetic radiation occurring in the range of wavelengths from approximately three hundred and ninety (390) nanometers to approximately seven hundred and fifty (750) nanometers. The infrared light spectrum (infrared light) includes electromagnetic radiation that ranges in wavelength from approximately seven hundred (700) nanometers to approximately thirty thousand (30,000) nanometers. The ultraviolet light spectrum (visible light) includes electromagnetic radiation occurring in the range of wavelengths from approximately one hundred (100) nanometers to approximately four hundred (400) nanometers. In an implementation, complementary metal-oxide-semiconductor (CMOS) fabrication techniques may be utilized to form the photodetector assembly 102. In another implementation, bipolar fabrication techniques may be utilized to form the photodetector assembly 102. In yet another implementation, BiCMOS fabrication techniques may be utilized to form the photodetector sensor(s). For example, the photodetector sensor(s) of the photodetector assembly 102 may comprise silicon based photodetectors. In another example, a group II-VI, III-V, or IV-VI compound semiconductor may be used. In this case, epitaxial techniques may be used to form the photodetector sensor in addition to standard wafer fabrication techniques.

The optical sensor 100 also includes one or more light emitters (a single light emitter 104 is illustrated). The light emitter 104 is configured to emit electromagnetic radiation in a limited spectrum of wavelengths and may be a light emitting diode. For example, the light emitter 104 may be an infrared light emitting diode (IR-LED) configured to emit electromagnetic radiation in the infrared light spectrum. The infrared light spectrum (infrared light) includes electromagnetic radiation that ranges in wavelength from approximately seven hundred (700) nanometers to approximately thirty thousand (30,000) nanometers. The light emitter 104 may also be configured to emit electromagnetic radiation in a known, predetermined pattern (e.g., emits a square wave of known width and frequency for a predetermined time) In another implementation, the light emitter 104 may be an ultraviolet light emitting diode (UV-LED) configured to emit electromagnetic radiation in the ultraviolet light spectrum. The ultraviolet light spectrum (UV light) includes electromagnetic radiation that ranges in wavelength from approximately one hundred (100) nanometers to approximately four hundred (400) nanometers. In another specific implementation, the light emitter 104 comprises a laser diode, such as a vertical-cavity surface-emitting laser (VCSEL), to manage a transmission cone of the electromagnetic radiation emitted by the light emitter 104.

In some instances, an integrated circuit device may be electrically connected to the photodetector assembly 102 and/or the light emitter 104. The integrated circuit device may be configured to provide drive signals to the light emitter to control operation of the emitter 104 and to provide signal processing functionality for the photodetector assembly 102. In one or more implementations, the integrated circuit device comprises driver circuitry, analog circuitry, digital circuitry, signal processing circuitry, and/or signal conversion circuitry.

In another specific implementation, as shown in FIG. 1B, the light emitter 104 may comprise a plurality of light emitters 104(1)-104(4). While only four light emitters are shown, it is understood that the optical sensor 100 may employ more or less depending on the configuration of the optical sensor 100. In this implementation, the light emitters 104(1)-104(4) may emit light occurring in the same approximate wavelength or occurring in different wavelengths. For example, a first light emitter 104(1) may emit electromagnetic radiation occurring in a first wavelength range (e.g., approximately six hundred and sixty (660) nanometers to approximately six hundred and eighty (680) nanometers), a second light emitter 104(2) may emit electromagnetic radiation occurring in a second wavelength range (e.g., approximately eight hundred and sixty (860) nanometers to approximately eight hundred and eighty (880) nanometers), a third light emitter 104(3) may emit electromagnetic radiation occurring in a third wavelength range (e.g., approximately three hundred (300) nanometers to approximately four hundred (400) nanometers), and so forth. For instance, one light emitter 104 may emit electromagnetic radiation occurring in the ultraviolet light spectrum, another light emitter 104 may emit electromagnetic radiation occurring in the infrared light spectrum, and another light emitter 104 may emit electromagnetic radiation occurring in the visible light spectrum.

As shown in FIG. 1A, the optical sensor 100 includes a transparent substrate 106 and is configured to be transparent to light occurring within wavelengths of interest. For example, the transparent substrate 106 may be at least substantially transparent to light occurring within a limited spectrum of wavelengths (e.g., transparent to light occurring within the infrared wavelength spectrum and not transparent to light occurring within the visible wavelength spectrum, or vice versa). The transparent substrate 106 may be configured in a variety of ways. For example, the transparent substrate 106 may be a glass substrate (e.g., Corning XG, Schott AF32, etc.). In another implementation, the transparent substrate 106 may comprise a silicon substrate, which is at least substantially transparent to infrared electromagnetic radiation. In another implementation, the transparent substrate 106 comprises a sapphire substrate. In yet another implementation, the transparent substrate 106 comprises a zinc-sulfide substrate. In yet another implementation, the transparent substrate 106 comprises a diamond substrate. The transparent substrate 106 may comprise a material having a coefficient of thermal expansion that is approximately matched to silicon. The transparent substrate 106 substrate may have an optical filter structure 108, such as an optical coating. The optical filter structure 108 may comprise a dichroic or interference filter, which may comprise a coating being anti-reflecting or highly-reflecting in certain portions of the wavelength spectrum, or having band-pass characteristics enabling transmission of certain wavelengths whilst blocking certain other wavelengths. In some instances, a optical filter structure 108 is applied to one or more surfaces 109A, 109B so as to minimize guided light formation and/or maximize attenuation of guided light rays. The optical filter structure 108 may be tuned to be anti-reflecting at the target wavelength of the emitter(s) 108 over an emission cone angle. The coating 108 may have reflectivity that is at least less than or equal to one percent (1%) of the wavelength of the light emitter 104. In some instances, the coating 108 can be selectively applied and/or patterned over the transparent substrate 106. In some instances, multiple coatings having differing optical properties (e.g., characteristics) may be selectively applied to different areas of the substrate 106. For example, the coating can be selectively applied and/or patterned over the portion of the transparent substrate 106 that corresponds to the light emitter 104 (e.g., portion of the surfaces 109A, 109B of the transparent substrate 106 as defined by a vertical axis extending from the light emitter 104). In some implementations, the coating 108 may be selectively applied over the photodetector assembly 102. In specific implementations, the optical filter structure 108 may comprise, but is not limited to: a titanium dioxide, a silicon oxide, a hafnium oxide, a vanadium oxide, silicon, germanium, magnesium fluoride, or a compound semiconductor coating. In some instances, the optical filter structure 108 comprises multi-layer stacks of the above-referenced compounds.

As shown in FIG. 1A, the optical sensor 100 includes one or more redistribution layers 110 deployed over the transparent substrate 106. The redistribution layers 110 may comprise a thin-film conductive material (e.g., aluminum, copper, titanium, titanium-tungsten, chromium, silver, gold, nickel, etc.) that functions rerouting and interconnection system between light emitters 104 and/or the photodetector sensors 102 to an area array of electrical interfaces 112, which are described in greater detail herein. For example, the redistribution layers 110 electrically interface the light emitters 104/photodetector sensor 102 with an external electronic device through the electrical interfaces 112. One or more dielectric layers 114 may be formed over the redistribution layers 110 for insulation purposes. In some implementations, the optical sensor 100 may include multiple redistribution layers 110 having dielectric layers 114 disposed there between for additional electrical redistribution.

As shown in FIG. 1A, the optical sensor 100 includes one or more electrical interfaces 112 that are configured to electrically interface the optical sensor 100 with a printed circuit board of an electronic device (e.g., an external electronic device). In some implementations, the electrical interfaces 112 comprise solder bumps 116. Solder bumps 116 are provided to furnish mechanical and/or electrical interconnection between the electrical interfaces 110 and corresponding pads formed on the surface of the printed circuit board. In one or more implementations, the solder bumps 116 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used. In some implementations, the electrical interfaces 112 may comprise anisotropic connectors.

The optical sensor 100 also includes one or more electrical interfaces 118 that electrically interface the optical sensor 102 with the redistribution layers 110. The electrical interfaces 118 may also electrically interface the light emitter(s) 104 with the redistribution layer 110. Thus, the light emitter(s) 104 and the photodetector assembly 102 can be directly mounted (e.g., attached) to the transparent substrate 106. For example, the electrical interfaces 118 serve to electrically connect the light emitter(s) 108 and/or the photodetector sensor(s) 106 with respective redistribution layers 110. The electrical interfaces 118 may comprise gold, copper, a gold compound, a silver compound, a silver-tin compound, a copper compound, a copper-silver compound, a copper-tin compound, or the like. In some cases, the interface 118 may comprise an electrically-conducting adhesive such as a silver-loaded epoxy, an anisotropic conducting film, or an anisotropic conducting paste. In some instances, the substrate 102 is directly attached to the transparent substrate 106 via suitable solder attachment processes or suitable thermo-sonic bonding processes.

In one or more implementations, the transparent substrate 106 may include one or more light modifying structures 120. In some implementations, the light modifying structures 120 utilized in the path of the emitter 104 are utilized to focus or spread the light emitted by the emitter 104 based upon the emitter type and application. In some implementations, the light modifying structures 120 may comprise one or more lenses 122 to focus and to transmit light incident upon the photodetector assembly 102. In some implementations, the light modifying structures 120, 124 in the optical path of the emitter 104 may comprise one or more lenses, diffractive optical elements, holographic optical elements, or scattering elements to distribute the light from the emitter in a desired fashion. As shown in FIG. 1A, the lens 122 may positioned over the surface 109A of the transparent substrate 106. It is contemplated that the lens 122 is configured to focus and to transmit light incident upon the transparent substrate 106 from multiple angles. The lens 122 may be configured as a diffractive lens such as a Fresnel lens, or a refractive lens, another type of lens, a lens structure formed (e.g., etched) into the transparent substrate 106, a polymer lens structure, or a glass structure formed over the surface 109A, or the like, that is configured to focus or concentrate the light incident on the lens 122 onto the assembly 102. In an implementation, the lens 120 may be concave. In other implementations, the lens 122 may be or convex. In another implementation, depending upon the configuration of the optical sensor 100, the lens 122 may be on either side of the transparent substrate 106. In yet another implementation, depending upon the configuration of the optical sensor 100, the lens 122 may be positioned between the transparent substrate 106 and the photodetector assembly 102 and/or the light emitter 104. In one or more embodiments, the light modifying structures 120 may be formed in the substrate 106 or may be formed (e.g., deposited) over the substrate 106. It is contemplated that the optical filter structure 108 may extend over the light modifying structures 120.

The light modifying structure 120 may also comprise a diffuser 124 (e.g., a scattering element). The diffuser 124 may be disposed over the surface 109A and/or the surface 109B of the transparent substrate 106. In some implementations, the diffuser 124 is positioned over the light emitter 104 to broaden the electromagnetic radiation emitted from the emitter 104. The diffuser 124 may formed in the transparent substrate 106 in a variety of ways. For example, the diffuser 124 may be etched in the transparent substrate 106. In other examples, the diffuser 124 may be printed onto the transparent substrate 106.

The optical sensor 100 may also employ one or more spacers 126 deployed over the transparent substrate 106. As shown in FIG. 1A, the spacers 126 are deployed over the surface 109A of the substrate 106 proximate to the edges 128, 130 of the substrate 106. The spacers 126 may be utilized to protect external optical elements from interfacing with the transparent substrate 106 or optical structures 120, 122, 124 thereon. In some implementations, the spacers 126 may comprise a suitable adhesive material that allows for the optical sensor 100 to be attached to an external device surface.

As shown in FIGS. 1A and 1B, the optical sensor 100 may include an encapsulation structure 132 that at least substantially encapsulates the photodetector assembly 102 and the light emitter(s) 104. In some implementations, the encapsulation structure 132 may comprise a suitable polymeric coating 134 that scatters and/or absorbs stray electromagnetic radiation to prevent cross-talk with the sensor 106. In some implementations, the coating 134 comprises a coating having at least approximately the same reflective index as the transparent substrate 106. For example, the coating 134 may comprise a suitable silicone material or a suitable epoxy material. For instance, the coating 134 may comprise a coating having scattering characteristics, such as suitable silicone or epoxy further comprising particles of a titanium dioxide composition, particles of a silicon oxide composition, or the like. In other instances, the coating 134 comprises a coating having absorbing characteristics, such as a suitable silicone or epoxy that further comprises a carbon black composition or the like. In other instances, the coating 134 comprises a coating having scattering and absorbing characteristics, such as a suitable silicone or epoxy that comprise carbon black composition, or the like, along with particles of a titanium dioxide composition, particles of a silicon oxide composition, or the like.

Example Mounting Process

The following discussion describes example techniques for attaching an optical sensor that comprises a light emitter and a photodetector assembly to a transparent substrate. The light emitter and the photodetector assembly may be fabricated utilizing complementary metal-oxide-semiconductor (CMOS) processing and packaging techniques. The light emitter fabrication process may additionally comprise epitaxial processes.

Figure 2:
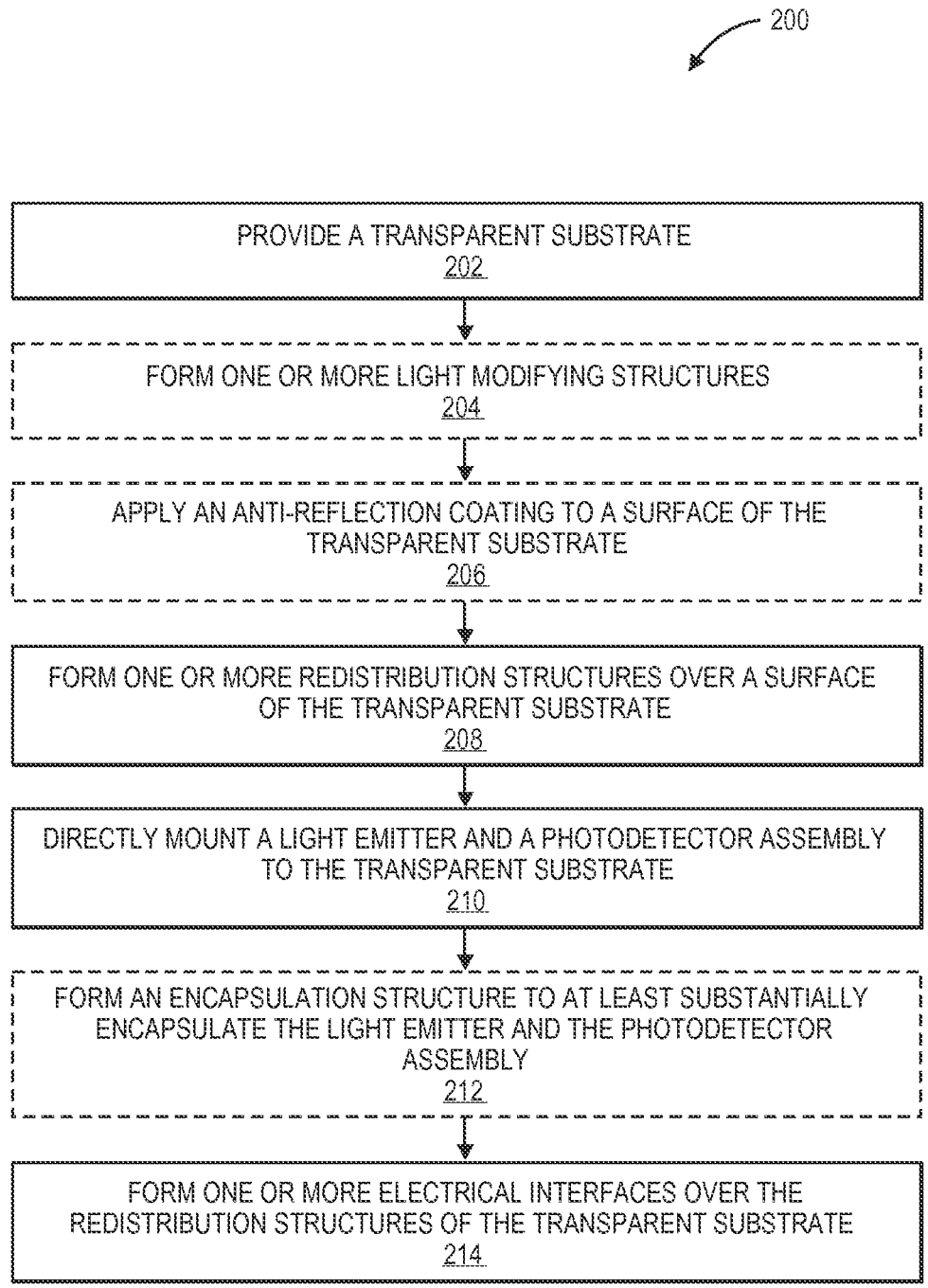
FIG. 2 is a flow diagram illustrating an example method in an example implementation for mounting a light emitter and/or a photodetector assembly with a transparent substrate to form an optical sensor, such as the sensor shown in FIGS. 1A and 1B.
Figure 3:
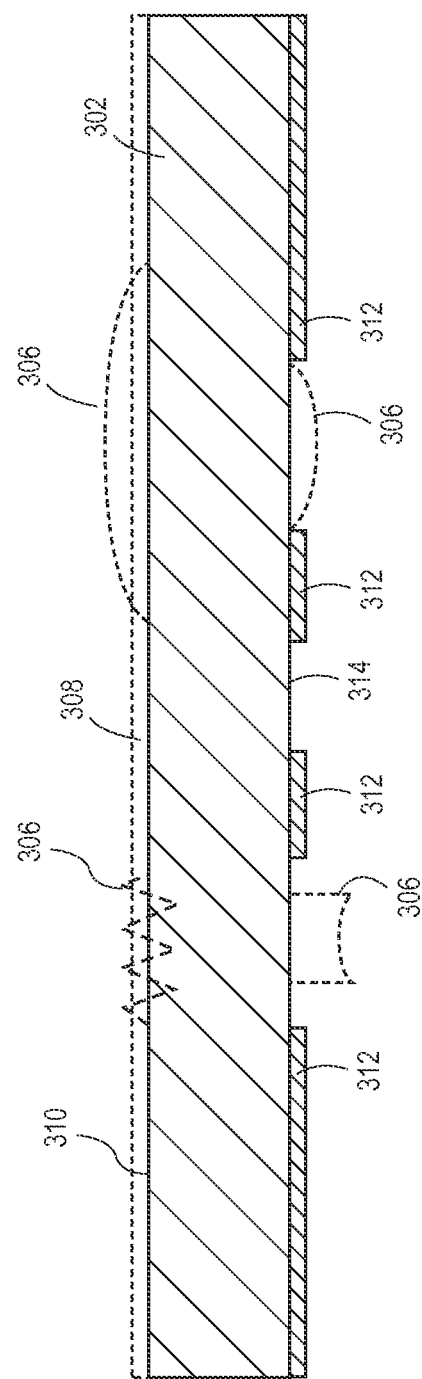
FIG. 3 is a diagrammatic partial cross-sectional side illustrating the processing of an example optical sensor illustrated in FIG. 1A in accordance with the techniques illustrated in FIG. 2.
Figure 4:
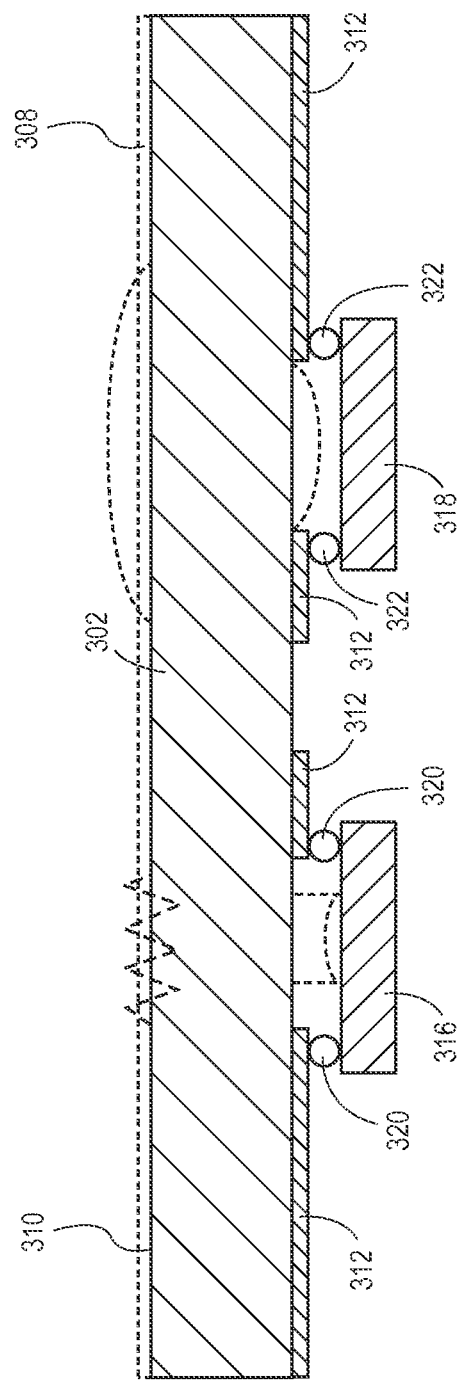
FIG. 4 is a diagrammatic partial cross-sectional side illustrating the processing of the example optical sensor illustrated in FIG. 1A in accordance with the techniques illustrated in FIG. 2.

FIG. 2 illustrates an example method 200 for directly mounting (e.g., attaching) a light emitter and/or a photodetector assembly to a transparent substrate to form an optical sensor 300. A transparent substrate is provided (Block 202). As described above, the transparent substrate 302 is at least substantially transparent to light occurring within a limited spectrum of wavelengths (e.g., transparent to light occurring within the infrared wavelength spectrum and not transparent to light occurring within the visible wavelength spectrum, or vice versa). In another example, the substrate 302 is transparent to all wavelengths of interest. One or more light modifying structures are formed (Block 204). In some implementations, one or more light modifying structures 306 are formed in or on the transparent substrate 302. For example, the light modifying structures 306 may include, but are not limited to: a lens, a diffuser, a scattering element, a diffractive optical element, a holographic optical element, or the like. As described above, the light modifying structures 306 may be formed on one or more surfaces of the transparent substrate 302.

In some instances, an optical filter structure, such as an interference filter, is applied to a surface of the transparent substrate (Block 206). For example, an optical filter structure 308 is applied to a surface 310 of the transparent substrate 302 to maximize attenuation of the guided electromagnetic radiation. In some instances, the optical filter structure 308 may be selectively applied to the transparent substrate 302. Additionally, the optical filter structure 308 may comprise one or more layers (e.g., a titanium dioxide, a silicon oxide, a hafnium oxide, a vanadium oxide, silicon, germanium, magnesium fluoride, or a compound semiconductor coating) that provide various optical filtering characteristics.

One or more redistribution structures are formed over a surface of the transparent substrate (Block 208). The transparent substrate 302 includes one or more redistribution structures 312 formed over the surface 314 of the transparent substrate 302. The redistribution structures 312 may be formed through one or more suitable deposition and/or etching processes. In some instances, the redistribution structures 312 comprise multiple redistribution structures with passivation layers insulating respective structures from one another.

As shown in FIG. 2, a photodetector assembly and at least one light emitter is directly mounted to the transparent substrate (Block 210). As described above, a light emitter 316 and a photodetector assembly 318 are directly mounted (e.g., attached) to the transparent substrate 302 via a suitable mounting process. For example, the electrical interfaces 320, 322 of the light emitter 316 and photodetector assembly 318 are mated with the corresponding redistribution structure 312 of the transparent substrate 302. For example, the light emitter 316 and the photodetector assembly 318 may be attached to the transparent substrate 302 through a solder attach process (e.g., solder reflow). In another example, the light emitter 316 and the photodetector assembly 318 may be attached to the transparent substrate 302 through a thermo-sonic bonding process (e.g., a bonding that can be formed below the melting points of the mating materials). In another example, the light emitter 316 and the photodetector assembly 318 may be attached to the transparent substrate 302 via a conducting adhesive, such as an anisotropic conducting past, an anisotropic conducting film, or a silver-loaded epoxy.

Figure 5:
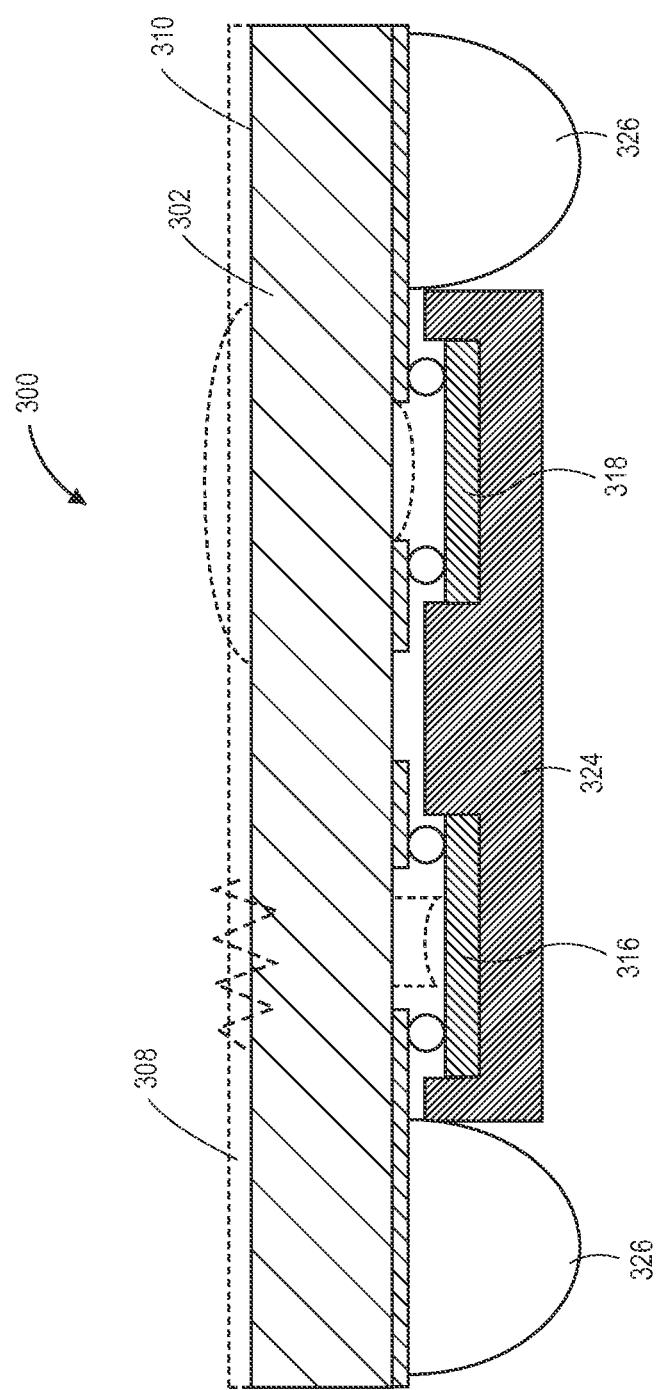
FIG. 5 is a diagrammatic partial cross-sectional side illustrating the processing of an example optical sensor illustrated in FIG. 1A in accordance with the techniques illustrated in FIG. 2.

As shown in FIG. 2, an encapsulation structure is formed to at least substantially encapsulate the light emitter and the photodetector assembly (Block 212). The encapsulation structure 324 may be formed by stencil printing, molding, jet dispensing, needle dispensing, lamination, or any other suitable process. In an implementation, an encapsulation structure 324 may formed to at least substantially encapsulate the light emitter 316 and the photodetector assembly 318. In some embodiments, the encapsulation structure 324 may encapsulate (e.g., cover) some, but not all of the components. In some embodiments, the encapsulation structure 324 does not encapsulate the components, but covers areas of the glass. In some implementations, the encapsulation structure 324 comprises a polymeric encapsulation structure. One or more electrical interfaces are formed over redistribution structures of the transparent substrate (Block 214). As shown in FIG. 5, in a specific implementation, solder balls are subjected to a reflow process to form solder bumps 3 over respective redistribution structures 312. The solder bumps 320 are utilized to provide a signal (e.g., a drive signal) to the emitter 316 from an external electronic device and to provide a signal from the photodetector sensor 312 to the external electronic device. In some implementations, the external electronic device may not communicate with the light emitter 316. For example, the external electronic device may communicate with the integrated devices that drive the emitter 316. It is understood that the specific order or hierarchy of steps in the methods disclosed are examples of a specific implementation. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An optical sensor comprising:
   a transparent substrate having a surface;
   at least one light emitter directly mounted to the surface of the transparent substrate, the at least one light emitter configured to emit light;
   a photodetector assembly directly mounted to the surface of the transparent substrate, the photodetector assembly configured to detect light and provide a signal in response thereto;
   a polymeric encapsulation structure disposed over the surface of the transparent substrate that at least substantially encapsulates the at least one light emitter and the photodetector assembly, the polymeric encapsulation structure comprising at least one of scattering elements or absorbing elements, the polymeric encapsulation structure having a surface distal to the surface of the transparent substrate; and
   a plurality of solder bumps disposed over the surface of the transparent substrate, respective solder bumps of the plurality of solder bumps extending beyond a plane that is co-planar with the surface of the polymeric encapsulation structure.

2. The optical sensor as recited in claim 1, wherein the transparent substrate includes at least one redistribution structure disposed thereon, and wherein the at least one light emitter and the photodetector assembly is electrically connected to the at least one redistribution structure.

3. The optical sensor as recited in claim 2, further comprising an electrical interconnection disposed between the at least one light emitter and the at least one redistribution structure comprises at least one of a gold-gold interconnection, a gold-tin interconnection, a silver-tin interconnection, a copper-tin interconnection or a copper-copper interconnection.

4. The optical sensor as recited in claim 1, wherein the at least one light emitter is configured to emit light in at least one of the visible light spectrum, the ultraviolet spectrum, or the infrared spectrum.

5. The optical sensor as recited in claim 1, wherein the at least one light emitter comprises a plurality of light emitters.

6. The optical sensor as recited in claim 1, wherein the at least one light emitter comprises a light emitting diode.

7. The optical sensor as recited in claim 1, wherein the at least one light emitter comprises a vertical-cavity surface-emitting laser.

8. The optical sensor as recited in claim 1, wherein the photodetector assembly includes at least one of photodiodes, photoresistors, or phototransistors.

9. The optical sensor as recited in claim 1, further comprising a light modifying structure disposed over the transparent substrate configured to modify light.

10. The optical sensor as recited in claim 9, wherein the light modifying structure comprises at least one of a lens, a diffuser, a scattering element, a diffractive optical element, or a holographic optical element.

11. The optical sensor as recited in claim 1, further comprising a polymeric layer that at least partially covers one surface of the transparent substrate, wherein the polymeric layer comprises at least one of scattering elements or absorbing elements.

12. The optical sensor as recited in claim 1, further comprising an anti-reflection coating disposed over the transparent substrate.

13. The optical sensor as recited in claim 1, wherein the transparent substrate comprises a glass substrate, a sapphire substrate, a diamond substrate, a zinc sulphide substrate, a zinc selenide substrate, a polymer substrate, a germanium substrate, or a silicon substrate.

14. The optical sensor as recited in claim 1, wherein the transparent substrate has coefficient of thermal expansion approximately matching the coefficient of thermal expansion of silicon.

15. The optical sensor as recited in claim 1, further comprising integrated circuitry electrically connected to the photodetector assembly, wherein the integrated device circuitry comprises at least one of driver circuitry, analog circuitry, digital circuitry, signal processing circuitry, or signal conversion circuitry.

16. A method comprising:
   forming one or more redistribution structures over a transparent substrate;
   mounting at least one light emitter to a surface of the transparent substrate, the at least one light emitter configured to emit light;
   mounting a photodetector assembly to the surface of the transparent substrate, the photodetector assembly configured to detect light and provide a signal in response thereto;
   forming an encapsulation structure over the surface of the transparent substrate, the encapsulation structure at least substantially encapsulates the at least one light emitter and the photodetector assembly, the encapsulation structure comprising at least one of scattering elements or absorbing elements, the encapsulation structure having a surface distal to the surface of the transparent substrate; and
   forming a plurality of solder bumps over the surface of the transparent substrate, respective solder bumps of the plurality of solder bumps extending beyond a plane that is co-planar with the surface of the polymeric encapsulation structure.

17. An optical sensor comprising:
   a transparent substrate having a surface;
   at least one light emitter directly mounted to the surface of the transparent substrate, the at least one light emitter configured to emit light;
   a photodetector assembly directly mounted to the surface of the transparent substrate, the photodetector assembly configured to detect light and provide a signal in response thereto;
   at least one redistribution structure disposed over the transparent substrate, the at least one light emitter and the photodetector assembly electrically connected to the at least one redistribution structure;
   an encapsulation structure disposed over the surface of the transparent substrate that at least substantially encapsulates the at least one light emitter and the photodetector assembly, the encapsulation structure comprising at least one of scattering elements or absorbing elements, the encapsulation structure having a surface distal to the surface of the transparent substrate; and
   a plurality of solder bumps disposed over the surface of the transparent substrate, respective solder bumps of the plurality of solder bumps extending beyond a plane that is co-planar with the surface of the encapsulation structure.

18. The optical sensor as recited in claim 17, further comprising a light modifying structure disposed over the transparent substrate configured to modify light.

* * * * *